(12) United States Patent
Meyer et al.

(10) Patent No.: US 11,728,073 B2
(45) Date of Patent: Aug. 15, 2023

(54) METHOD FOR MANUFACTURING AN ELECTRONIC COMPONENT

(71) Applicant: Infineon Technologies AG, Neubiberg (DE)

(72) Inventors: Markus Meyer, Sinzing (DE); Jorge Eduardo Adatti Estevez, Munich (DE); Alexandra Marina Roth, Neumarkt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/454,545

(22) Filed: Nov. 11, 2021

(65) Prior Publication Data
US 2022/0199297 A1 Jun. 23, 2022

(30) Foreign Application Priority Data
Dec. 21, 2020 (EP) .................................... 20216116

(51) Int. Cl.
| | | |
|---|---|---|
| *C23C 16/26* | (2006.01) | |
| *H01C 17/00* | (2006.01) | |
| *C23C 16/56* | (2006.01) | |
| *H01C 17/065* | (2006.01) | |
| *G01N 27/12* | (2006.01) | |

(52) U.S. Cl.
CPC .......... *H01C 17/003* (2013.01); *C23C 16/26* (2013.01); *C23C 16/56* (2013.01); *H01C 17/06506* (2013.01); *G01N 27/12* (2013.01)

(58) Field of Classification Search
None
See application file for complete search history.

(56) References Cited

U.S. PATENT DOCUMENTS

| 9,391,107 B1 * | 7/2016 | Liao .................. H01L 27/14636 |
| 2015/0008541 A1 * | 1/2015 | Hong .................. B81C 1/00182 |
| | | 257/415 |

FOREIGN PATENT DOCUMENTS

| CN | 111398364 A | 7/2020 |
| JP | H0587763 A | 4/1993 |
| JP | 2019049427 A | 3/2019 |

OTHER PUBLICATIONS

CNF Users, "Photolithography Basics", XP055809345, Retrieved from the Internet: URL: https://www.cnfusers.cornell.edu/sites/default/files/Area, Dec. 15, 2020, 6 pages.

* cited by examiner

*Primary Examiner* — Shamim Ahmed
*Assistant Examiner* — Bradford M Gates
(74) *Attorney, Agent, or Firm* — Slater Matsil, LLP

(57) ABSTRACT

A method for manufacturing an electronic component includes providing a substrate and a functional layer supported by the substrate; forming a structured protection layer on a side of the substrate to which the functional layer is attached, wherein the structured protection layer has a recess so that a portion of the functional layer is exposed; applying a dispersion comprising a solvent and electrically conductive components to the exposed portion of the functional layer so that the recess is at least partially filled with the dispersion; drying the dispersion in order to create an electrically conductive layer; and removing the structured protection layer.

15 Claims, 11 Drawing Sheets

METHOD FOR MANUFACTURING AN ELECTRONIC COMPONENT

This application claims the benefit of European Patent Application No. 20216116, filed on Dec. 21, 2020, which application is hereby incorporated herein by reference.

TECHNICAL FIELD

Embodiments relate to a method for manufacturing an electronic component. More particularly, embodiments relate to a method for manufacturing an electronic component, wherein a dispersion is applied to a functional layer and dried in order to create an electrically conductive layer.

BACKGROUND

Obtaining electrically conductive layers having a defined pattern by applying and drying a dispersion is a challenge when using selective deposition techniques such as inkjet printing. In particular, a material accumulation on the edge of the pattern of the electrically conductive layer due to the Marangoni effect leads to a conductive path around the desired pattern of the electrically conductive layer. This results in poor yield in subsequent devices such as chemo-resistive gas sensors.

Thus, there is a need for an improved method for manufacturing an electronic component.

The problem is solved by a method for manufacturing an electronic component, wherein the method comprises the steps of:

providing a substrate and a functional layer supported by the substrate;

forming a structured protection layer on a side of the substrate, to which the functional layer is attached to, wherein the structured protection layer has one or more recesses so that one or more portions of the functional layer are exposed;

applying a dispersion comprising a solvent and electrically conductive components to at least one of the exposed portions of the functional layer so that at least one of the recesses is at least partially filled with the dispersion;

drying the dispersion in order to create an electrically conductive layer;

removing the structured protection layer.

The substrate may be made from any material, such as silicon or glass, which provides mechanical and electrical properties suitable as a basis for producing electrical component.

The functional layer may be any layer suitable for manufacturing an electrical component. The functional layer may comprise several sub layers.

The term structured protection layer refers to any layer, which protects portions of the functional layer from being covered by the dispersion during the application of the dispersion and which has one or more recesses, in which portions of the functional layers are exposed so that we are covered by the dispersion during the application of the dispersion. The structured protection layer may be manufactured using a photolithography process. In particular, the protection layer may be a photoresist being structured by a lift-off process using a resist mask previously applied.

The term dispersion in general refers to a mixture of a liquid and solid particles. Here, the dispersion comprises a solvent and electrically conductive (solid) components, such as nanoparticles. The type of the solvent on the top of the electrically conductive components depends on the use case. Synonyms for the term dispersion are ink or paste.

The dispersion may be dried by removing the solvent.

The method is suitable for producing any kind of electronic components, which comprise an electrically conductive layer, which is formed by applying and drying a dispersion. In particular, the method is suitable for producing a chemo resistive gas sensor having a gas sensitive electrically conductive layer, which is produced by applying and drying a dispersion.

The method according to the disclosure allows producing an electrically conductive layer having a defined pattern without any coffee ring so that a performance of subsequent devices such as chemo-resistive gas sensors, in which the electrically conductive layer may be used as gas sensitive element, is improved.

With this method, in addition to very large areas, it is also possible to generate much smaller printed areas, which otherwise could not be achieved by the actual printing process due to the limitation of the drop size and/or adjustment accuracy.

According to embodiments, the method further comprises the steps of:

applying a sacrificial layer to the functional layer before forming the structured protection layer;

wherein the step of forming the structured protection layer comprises the steps of:

forming the structured protection layer on the sacrificial layer, wherein in each of the recesses of the structured protection layer one portion of the sacrificial layer is exposed;

removing the exposed portions of the sacrificial layer after the structured protection layer is formed on the sacrificial layer.

The sacrificial layer may protect at least portions of the functional layer during the step of removing the structured protection layer. This may be necessary, in case that the method used for removing the structured protection layer could damage the unprotected functional layer. After the step of removing the structured protection layer, the sacrificial layer may be removed in part or completely.

SUMMARY

According to embodiments, the functional layer extends over a cavity of the substrate, wherein the structured protection layer is applied to a side of the functional layer, which is facing away from the substrate. These features provide a thermally insulation of the electrically conductive layer from the substrate, which is, for example, desired in such cases, in which the electrically conductive layer is configured as sensing element of a chemo-resistive gas sensor.

According to embodiments, the sacrificial layer is applied by a chemical vapor deposition process.

According to embodiments, the sacrificial layer comprises carbon.

According to embodiments, the structured protection layer is formed by a photolithographic process, wherein the structured protection layer comprises a photoresist. The structured protection layer may be removed by using an acetone dip.

According to embodiments, the portions of the sacrificial layer, which are exposed in the recesses, are removed by a first etching process. The first etching process could use a plasma ash step.

According to embodiments, the dispersion is applied by an ink jet printing process. Inkjet printing processes allow applying the dispersion on selected portions of the, in particular on the recess or recesses of the structured protection layer, so that the quality of the dispersion necessary may be lowered.

According to embodiments, the dispersion is applied by a spray coating process. Spray coating processes allow applying the dispersion in a very short time.

According to embodiments, the functional layer comprises a contact arrangement, wherein the contact arrangement is formed in such way that the electrically conductive layer is connected to the contact arrangement so that an electrical resistance of the electrically conductive layer or an electrical capacity between the electrically conductive layer and a reference electrode connected to the contact arrangement can be sensed using the contact arrangement. These features are advantage for all types of resistive sensors.

According to embodiments, the electronic component is a chemo-resistive gas sensor, wherein the electrically conductive layer is configured for sensing one or more gases in a mixture of gases, wherein an electrical resistance of the electrically conductive layer or an electrical capacity between the electrically conductive layer and a reference electrode depends on the mixture of gases.

A conventional method for gas measurement is the measurement of the change in resistance of a gas-sensitive electrically conductive layer between the electrodes of an interdigital structure. Gas molecules such as $NO_2$ or $O_3$ adsorb on the gas-sensitive electrically conductive layer and thus lead to a charge-density shift in the gas-sensitive electrically conductive layer and thus to a change in resistance. This change in resistance can be measured and is therefore evidence of an existing gas.

The dispersion may comprise components made from graphene or made from any other components interacting electrically with gases.

The manufacturing method according to the disclosure avoids coffee rings around the desired pattern of the gas sensitive electrically conductive layer, so that the performance of the chemo-resistive gas sensor is increased.

According to embodiments, the functional layer comprises a heating element configured for heating the electrically conductive layer. The heating element allows controlling the temperature of the electrically conductive layer, which is, for example, desired that chemo-resistive gas sensors.

According to embodiments, the step of applying the dispersion to the at least one of the exposed portions of the functional layer is done in such way that the dispersion reaches an outer edge of the at least one of the recesses. Such features ensure that the electrically conductive layer has a uniform thickness the whole pattern.

According to embodiments, the step of applying the dispersion to the exposed portion of the functional layer is done in such way that the dispersion extends over the outer edge of the recess.

According to embodiments, the protection layer and the portion of the dispersion extending over the edge of the recess are removed by a second etching process. The second etching process may use an acetone dip. Such features ensure that the coffee ring occurs outside of the desired pattern of the electrically conductive layer and that the coffee ring will be removed by the second etching process.

BRIEF DESCRIPTION OF THE DRAWINGS

Preferred embodiments of the invention are subsequently discussed with respect to the accompanying drawings, in which.

Figure 1:
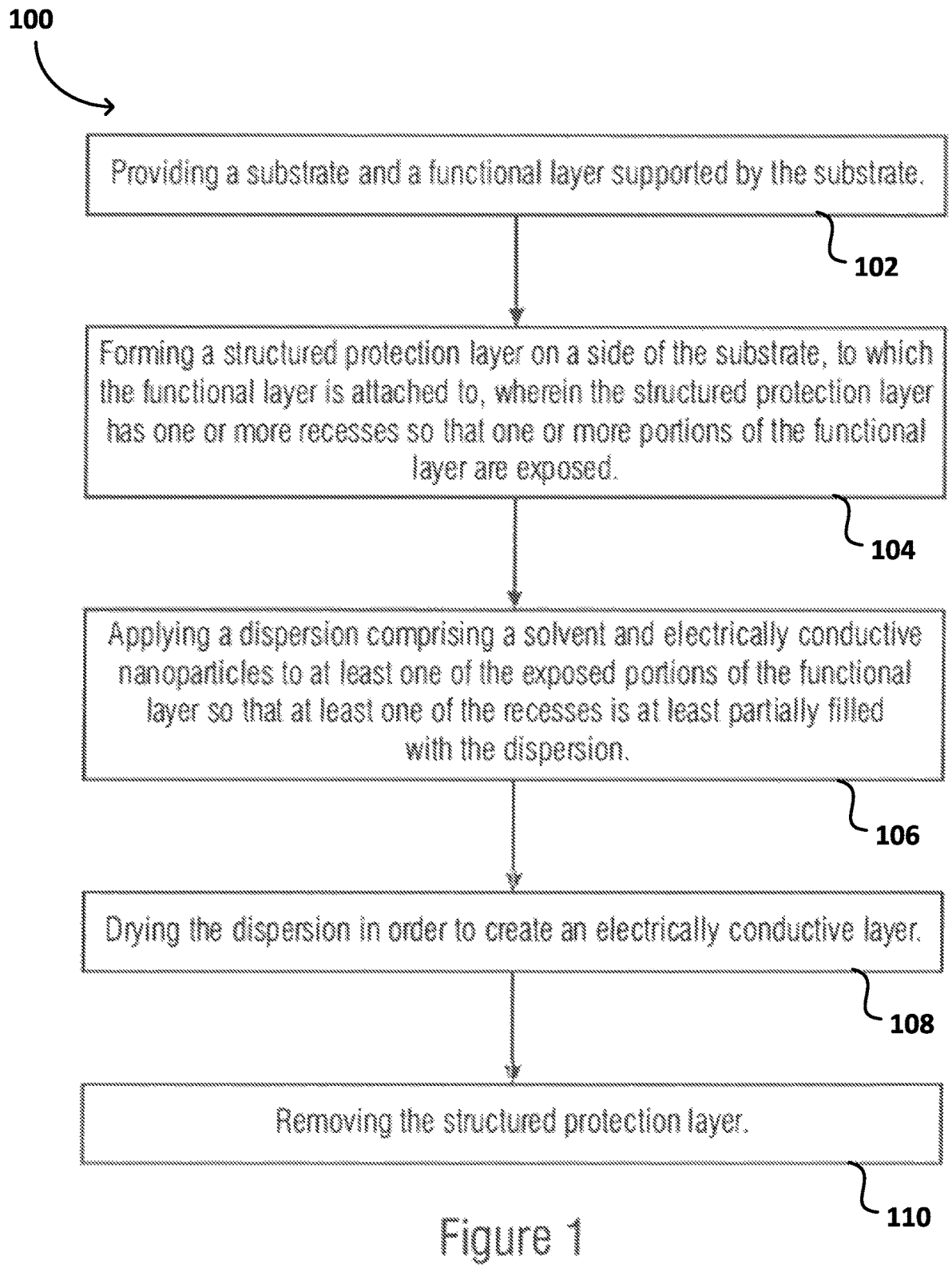
FIG. 1 illustrates a first exemplary embodiment of a method according to the disclosure in a schematic view.

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details is set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates a first exemplary embodiment of a method 100 for manufacturing an electronic component 1 according to the disclosure in a schematic view. The method comprises the steps of: providing a substrate 2 and a functional layer 3 supported by the substrate 2 at step 102; forming a structured protection layer 4 on a side of the substrate 2, to which the functional layer 3 is attached to, wherein the structured protection layer 4 has one or more recesses 5 so that one or more portions 6 of the functional layer 3 are exposed at step 104; applying a dispersion 7 comprising a solvent and electrically conductive components to at least one of the exposed portions 6 of the functional layer 3 so that at least one of the recesses 6 is at least partially filled with the dispersion 7 at step 106; drying the dispersion 7 in order to create an electrically conductive layer 8 at step 108; and removing the structured protection layer 4 at step no.

The steps of the first exemplary embodiment of a method for manufacturing an electronic component 1 are explained in more details in FIGS. 3 to 6.

Figure 2:
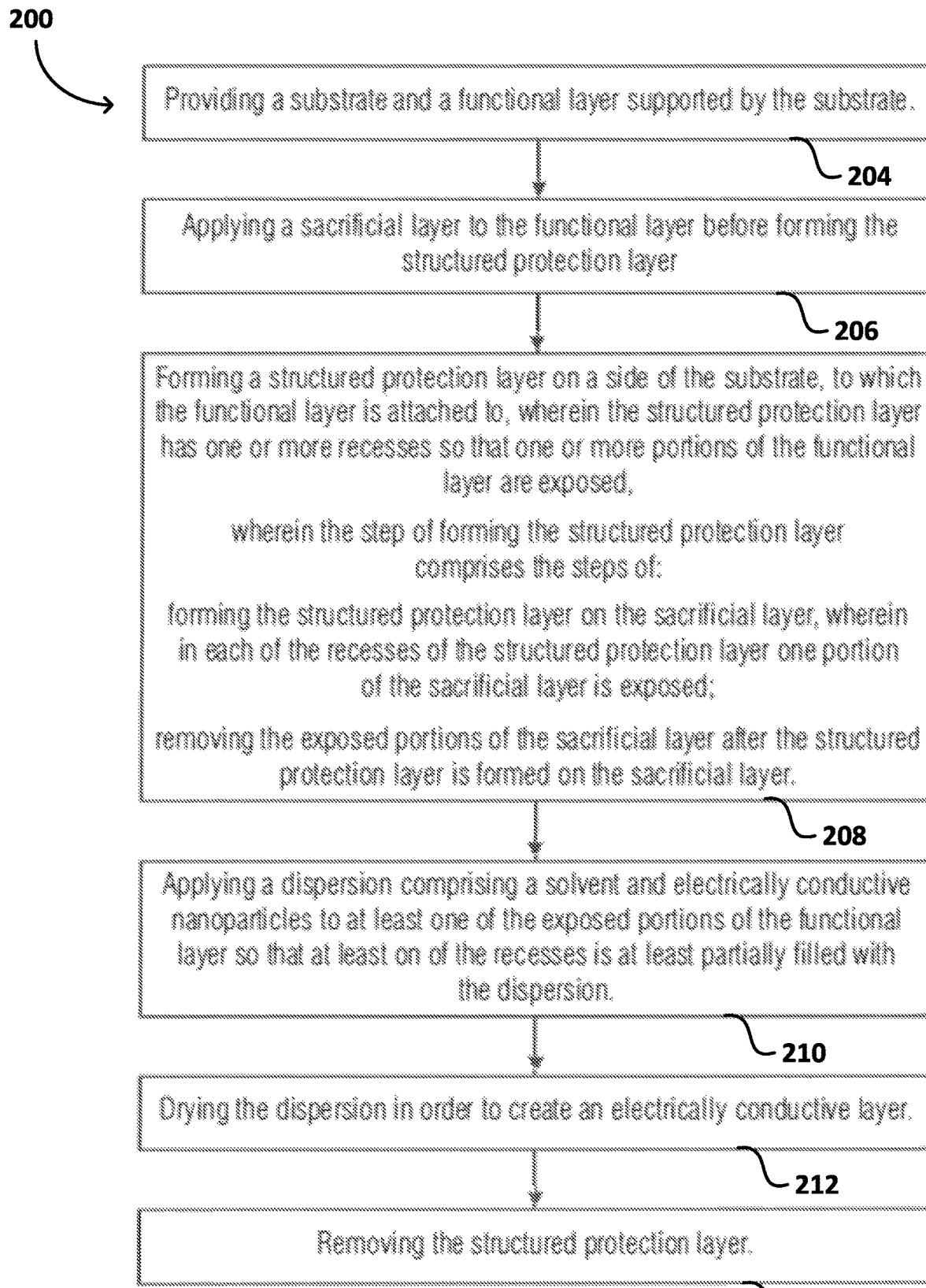
FIG. 2 illustrates a second exemplary embodiment of a method according to the disclosure in a schematic view.

FIG. 2 illustrates a second exemplary embodiment of a method 200 for manufacturing an electronic component 1 according to the disclosure in a schematic view. The method comprises the steps of: providing a substrate 2 and a functional layer 3 supported by the substrate 2 at step 202; forming a structured protection layer 4 on a side of the substrate 2, to which the functional layer 3 is attached to, wherein the structured protection layer 4 has one or more recesses 5 so that one or more portions 6 of the functional layer 3 are exposed at step 206; applying a dispersion 7 comprising a solvent and electrically conductive components to at least one of the exposed portions 6 of the functional layer 3 so that at least one of the recesses 6 is at least partially filled with the dispersion 7 at step 208; drying the dispersion 7 in order to create an electrically conductive layer 8 at step 210; removing the structured protection layer 4 at step 212; and applying a sacrificial layer 9 to the functional layer 3 before forming the structured protection layer 4 at step 204, wherein the step of forming the structured protection layer 4 comprises the steps of: forming the structured protection layer 4 on the sacrificial layer 9, wherein in each of the recesses 5 of the structured protection layer 4 one portion of the sacrificial layer 9 is exposed; and removing the exposed portions 10 of the sacrificial layer 9 after the structured protection layer 4 is formed on the sacrificial layer 9 at step 206.

The steps of the second exemplary embodiment of a method for manufacturing an electronic component 1 are explained in more details in FIGS. 3 and 7 to 11.

Figure 3:
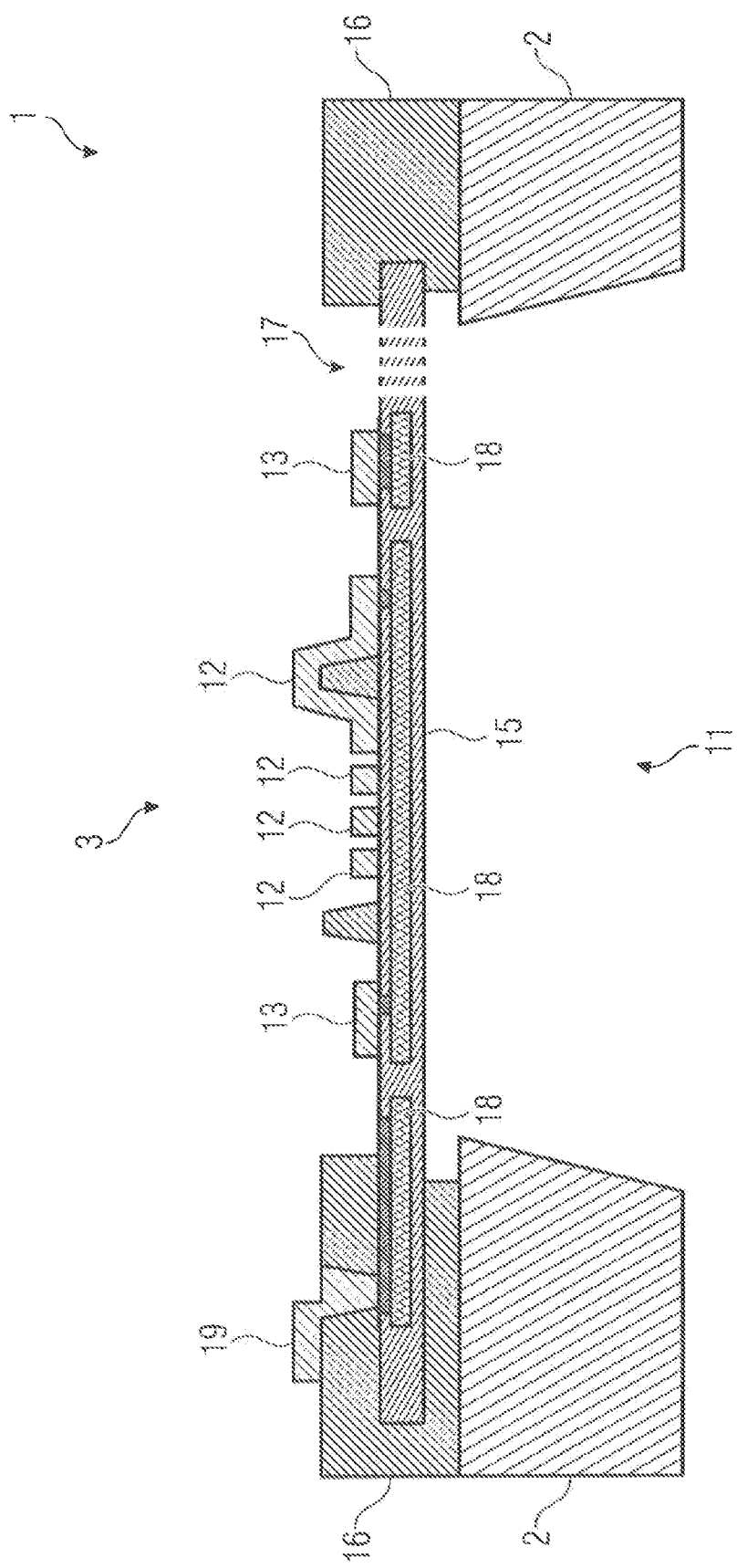
FIG. 3 illustrates an embodiment of the step of providing a substrate and a functional layer supported by the substrate of a method according to the disclosure in a schematic view.

FIG. 3 illustrates an embodiment of the step of providing a substrate 2 and a functional layer 3 supported by the substrate 2 of a method according to the disclosure in a schematic view.

In some embodiments, the functional layer 3 extends over a cavity 11 of the substrate 2, wherein the structured protection layer 4 is applied to a side of the functional layer 3, which is facing away from the substrate 2.

The substrate 2 and the functional layer 3 in the embodiment of FIG. 3 form of pre-product for an electronic component 1, which may be a chemo-resistive gas sensor.

The exemplary functional layer 3 comprises a contact arrangement 12, which is intended for contacting the electrically conductive layer 8, which may be sensing element of the chemo-resistive gas sensor, and which is formed at a later stage. Moreover, the exemplary functional layer 3 comprising a heating element 13, which is configured for heating the electrically conductive layer 8, so that, in particular, the sensing element of the chemo-resistive gas sensor may be operated at different temperatures.

The exemplary functional layer 3 comprises an electrically insulating membrane 15, which spans over a cavity 11 of the substrate 2. The membrane 15 is fixed to the substrate 2 by the support element 16. The membrane 15 comprises a ventilation opening 17, which ensures a pressure equalization between a side of the membrane 15 facing towards the substrate 2 and a side of the membrane 15 facing away from the substrate 2.

Moreover, the exemplary functional layer 3 comprises a conductor arrangement 18, which electrically connects the electrically conductive layer 8 and the heating element 13 to order contacts 19, which may be used to connect the electrically conductive layer 8, in particular the sensing element of the gas sensor, and the heating element to a control and sensing processor.

Figure 4:
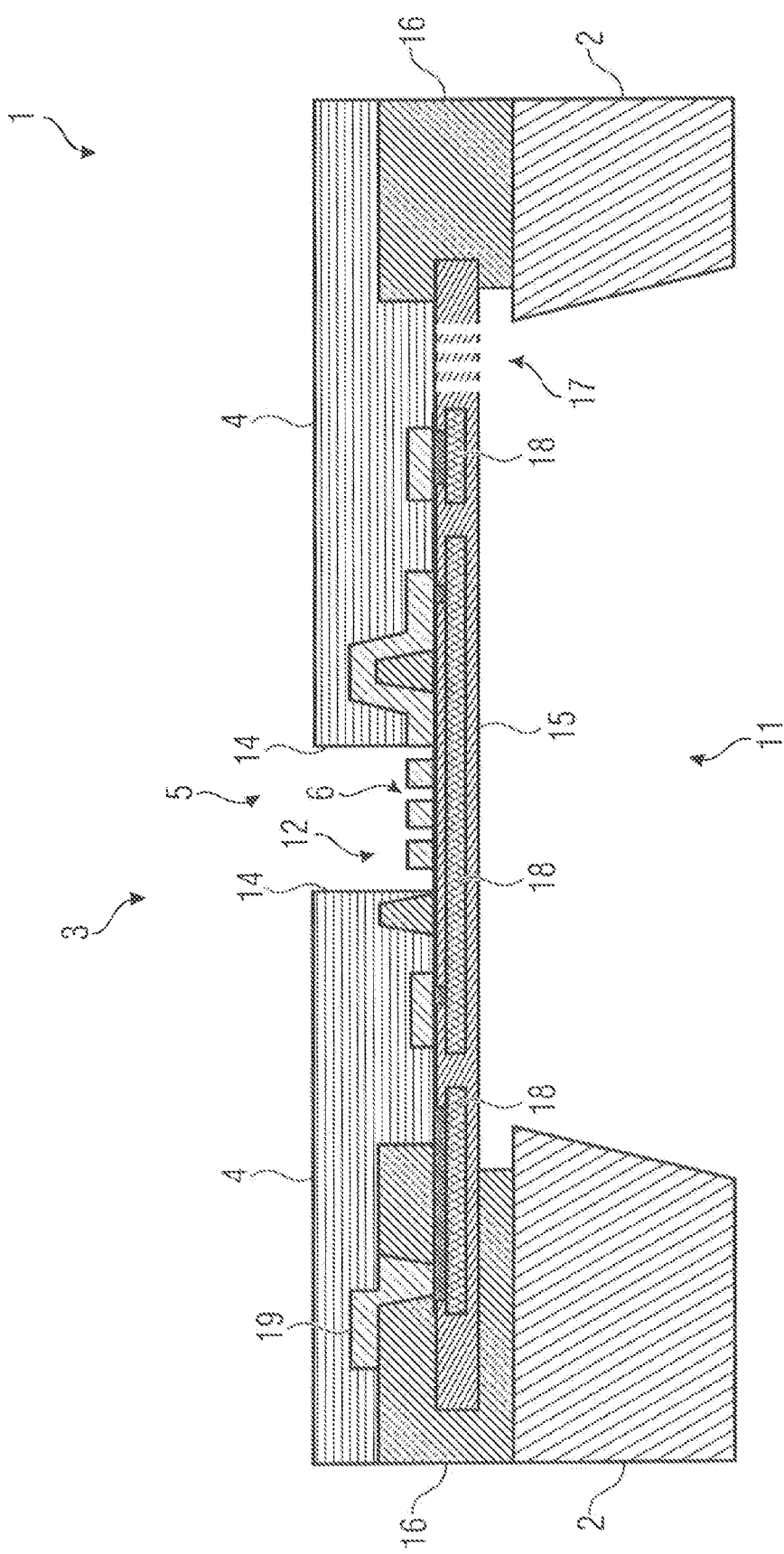
FIG. 4 illustrates an embodiment of the step of forming a structured protection layer on a side of the substrate, to which the functional layer is attached to, wherein the structured protection layer has one or more recesses so that one or more portions of the functional layer are exposed of a method according to the disclosure in a schematic view.

FIG. 4 illustrates an embodiment of the step of forming a structured protection layer 4 on a side of the substrate 2, to which the functional layer 3 is attached to, wherein the structured protection layer 4 has one or more recesses 5 so that one or more portions 6 of the functional layer 3 are exposed of a method according to the disclosure in a schematic view.

In some embodiments, the structured protection layer 4 is formed by a photolithographic process, wherein the structured protection layer comprises a photoresist.

In the embodiment of FIG. 4, the structured protection layer 4 comprises a recess 5, which is formed in such way that a portion 6 of the functional layer 3, which comprises the contact arrangement 12 at least partially, is exposed.

Figure 5:
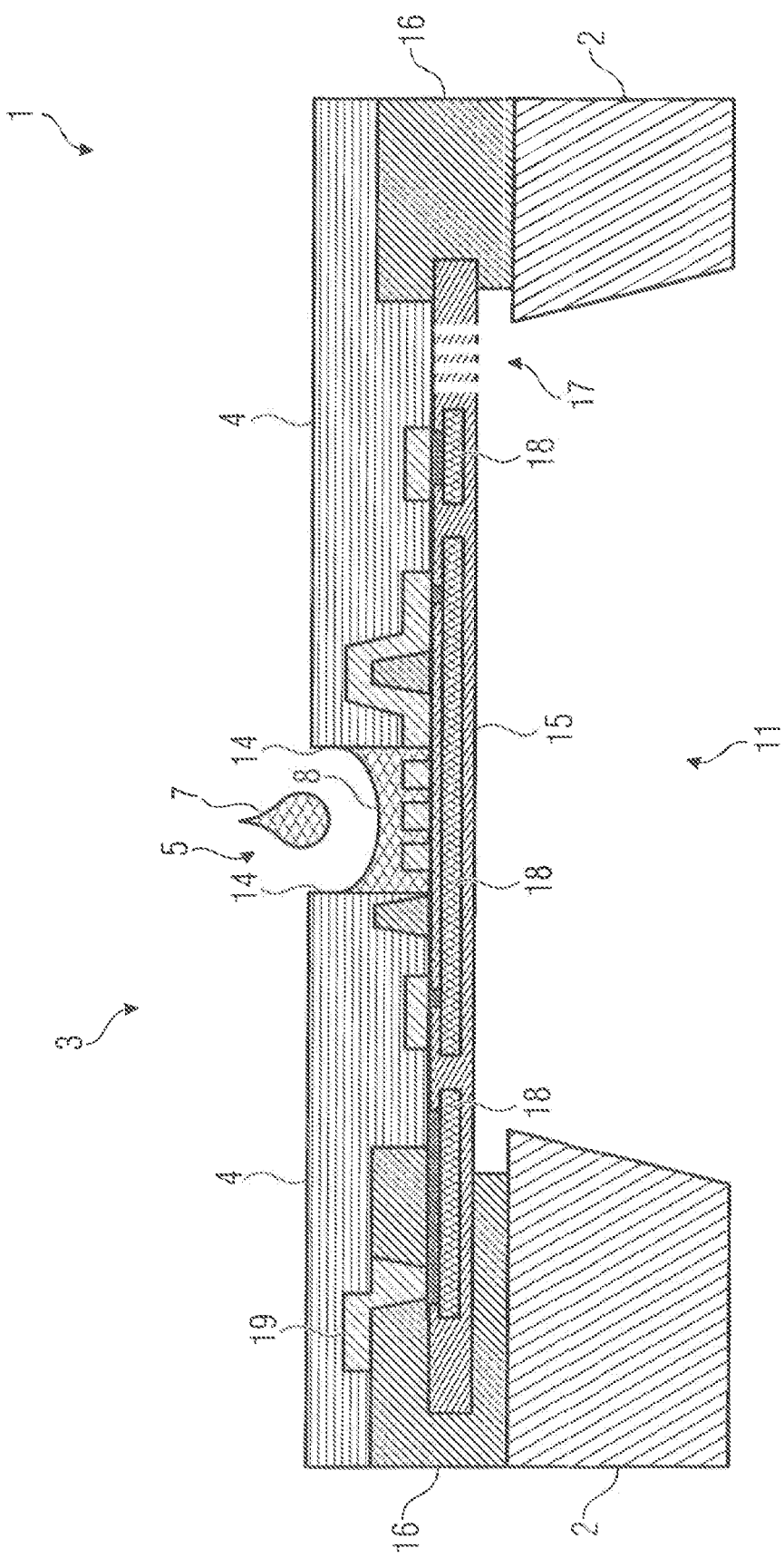
FIG. 5 illustrates an embodiment of the step of applying a dispersion comprising a solvent and electrically conductive components to at least one of the exposed portions of the functional layer so that at least one of the recesses is at least partially filled with the dispersion of a method according to the disclosure in a schematic view.

FIG. 5 illustrates an embodiment of the step of applying a dispersion 7 comprising a solvent and electrically conductive components to at least one of the exposed portions 6 of the functional layer 3 so that the at least one recess 5 is at least partially filled with the dispersion 7 of a method according to the disclosure in a schematic view.

In some embodiments, the dispersion 7 is applied by an ink jet printing process.

In some embodiments, the dispersion 7 is applied by a spray coating process.

In some embodiments, the step of applying the dispersion 7 to the at least one of the exposed portions 6 of the functional layer 3 is done in such way that the dispersion 7 reaches an outer edge 14 of the at least one of the recesses 5.

In some embodiments, the step of applying the dispersion 7 to the at least one of the exposed portions 6 of the functional layer 3 is done in such way that the dispersion 7 extends over the outer edge of the at least one of the recesses 5.

In some embodiments, the protection layer 4 and the portion of the dispersion 7, which extends over the outer edge 14 of the at least one of the recesses 5 are removed by a second etching process.

Figure 6:
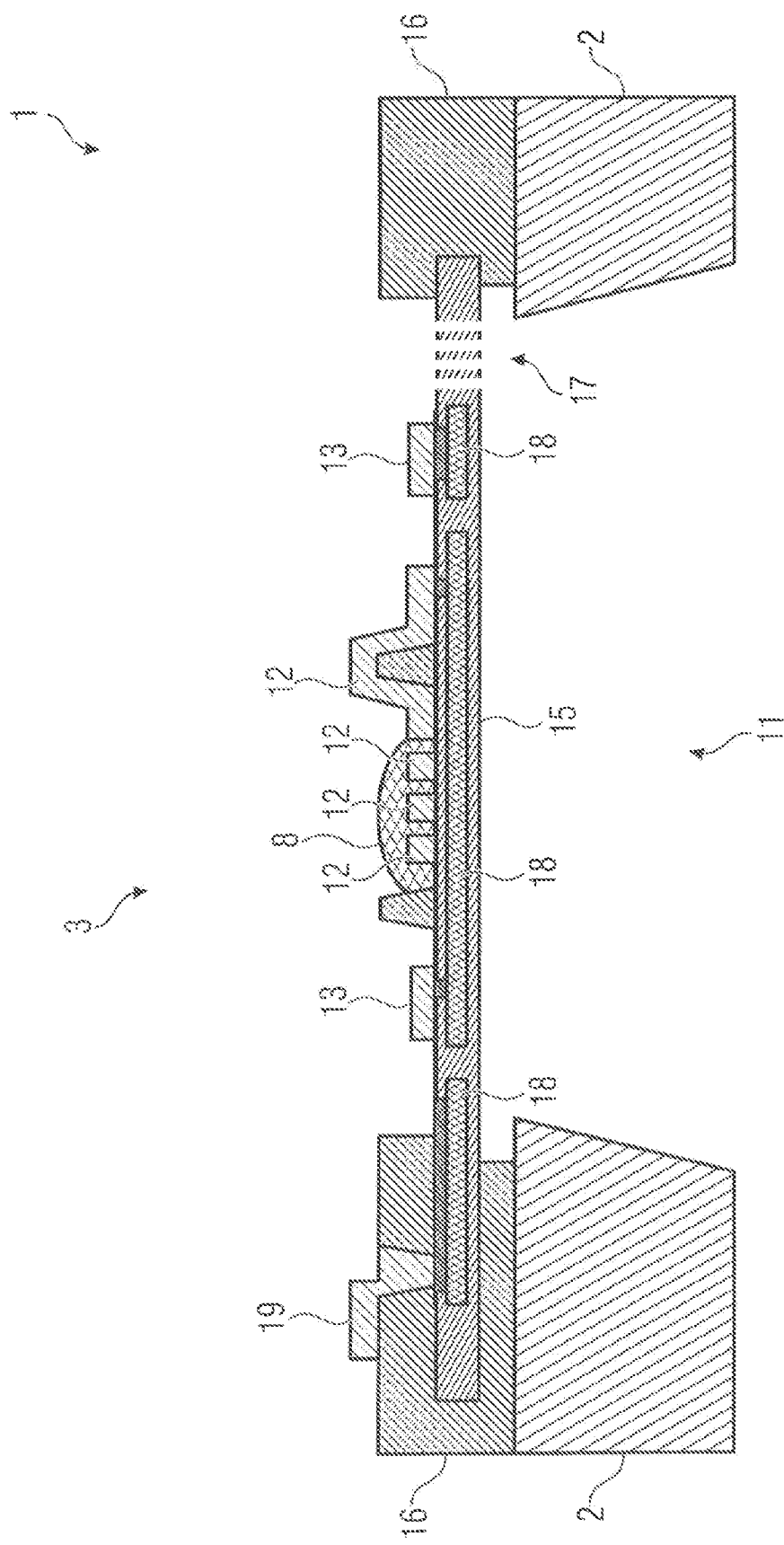
FIG. 6 illustrates an embodiment of the steps of drying the dispersion in order to create an electrically conductive layer and of removing the structured protection layer of a method according to the disclosure in a schematic view.

FIG. 6 illustrates an embodiment of the steps of drying the dispersion 7 in order to create an electrically conductive layer 8 and of removing the structured protection layer 4 of a method according to the disclosure in a schematic view.

In some embodiments, the electronic component 1 is a chemo-resistive gas sensor 1, wherein the electrically conductive layer 8 is configured for sensing one or more gases in a mixture of gases, wherein an electrical resistance of the electrically conductive layer 8 or an electrical capacity between the electrically conductive layer 8 and a reference electrode depends on the mixture of gases.

In some embodiments, the functional layer 3 comprises a contact arrangement 12, wherein the contact arrangement is formed in such way that the electrically conductive layer 8 is connected to the contact arrangement 12 so that an electrical resistance of the electrically conductive layer 8 or an electrical capacity between the electrically conductive layer 8 and a reference electrode connected to the contact arrangement 12 can be sensed using the contact arrangement 12.

In some embodiments, the functional layer comprises 3 a heating element 13 configured for heating the electrically conductive layer 8.

It can be seen in FIG. 6 that the electrically conductive layer 8 has no coffee ring-like conductive path outside of the actual sensing area.

Figure 7:
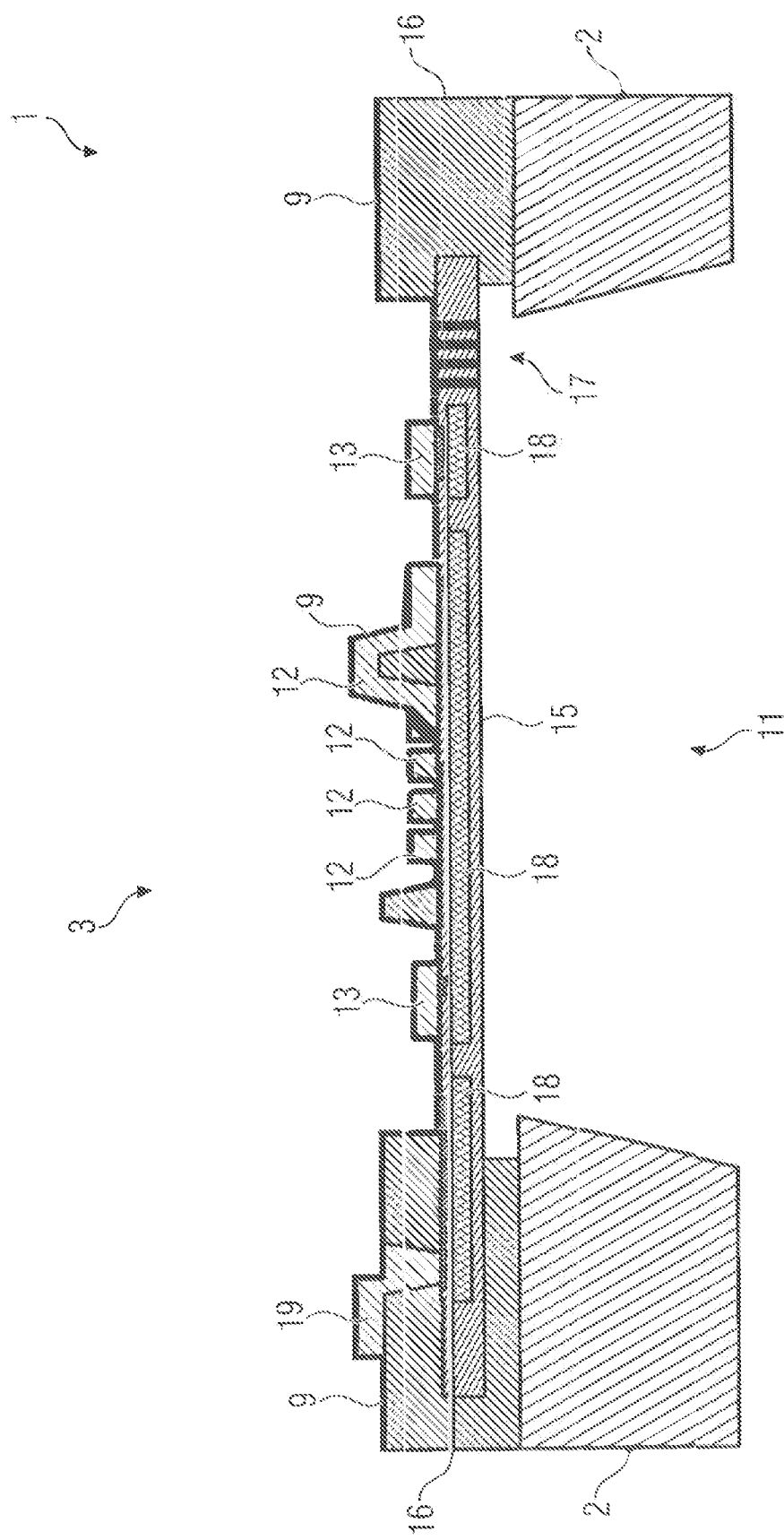
FIG. 7 illustrates an embodiment of the step of applying a sacrificial layer to the functional layer before forming the structured protection layer of a method according to the disclosure in a schematic view.

FIG. 7 illustrates an embodiment of the step of applying a sacrificial layer 9 to the functional layer 3 before forming the structured protection layer 4 of a method according to the disclosure in a schematic view.

In some embodiments, the sacrificial layer 9 is applied by a chemical vapor deposition process.

In some embodiments, the sacrificial layer 9 comprises carbon.

In some embodiments, the portions 10 of the sacrificial layer 9, which are exposed in the recesses 5, are removed by a first etching process.

In the embodiment of FIG. 7, the sacrificial layer 9 extends over the complete side of the functional layer 3, which is facing away from the substrate 2. In addition, the ventilation opening 17 is covered by the sacrificial layer 9.

Figure 8:
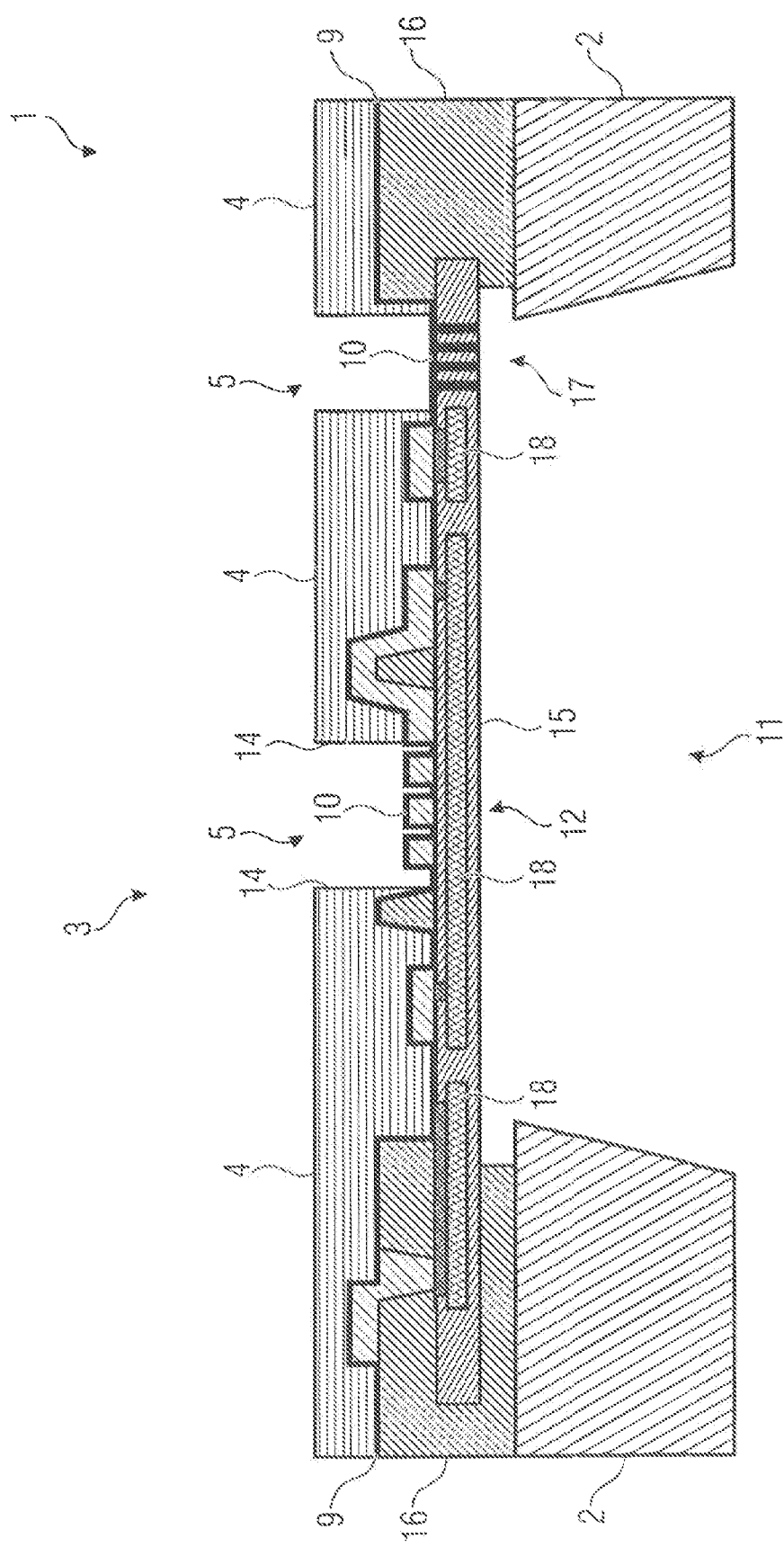
FIG. 8 illustrates an embodiment of the step of forming the structured protection layer on the sacrificial layer, wherein in each of the recesses of the structured protection layer one portion of the sacrificial layer is exposed of a method according to the disclosure in a schematic view.

FIG. 8 illustrates an embodiment of the step of forming the structured protection layer 4 on the sacrificial layer 9, wherein in each of the recesses 5 of the structured protection layer 4 one portion of the sacrificial layer 9 is exposed of a method according to the disclosure in a schematic view.

In the embodiment of FIG. 8, the structured protection layer 4 comprises two recesses 5. One of the recesses 5 is arranged in such way that a first portion 10 of the sacrificial layer 9, which covers at least a part of the contact arrangement 12, is exposed. The other of the recesses 5 is arranged in such way, that the second portion 10 of the sacrificial layer 9, which covers the ventilation opening 17, is exposed.

Figure 9:
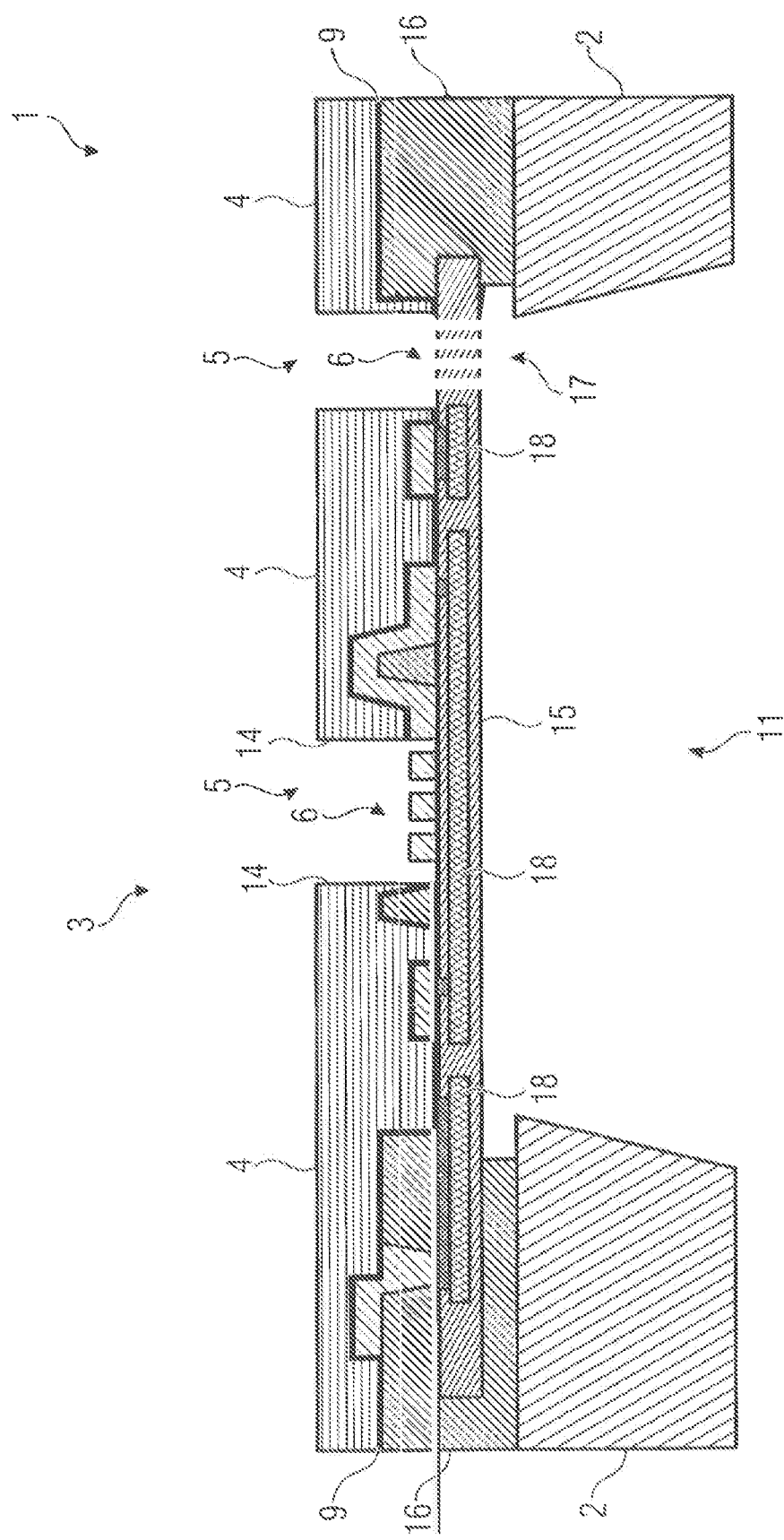
FIG. 9 illustrates an embodiment of the step of removing the exposed portions of the sacrificial layer after the structured protection layer is formed on the sacrificial layer of a method according to the disclosure in a schematic view.

FIG. 9 illustrates an embodiment of the step of removing the exposed portions 10 of the sacrificial layer 9 after the structured protection layer 4 is formed on the sacrificial layer 9 of a method according to the disclosure in a schematic view.

In the embodiment of FIG. 9, both exposed portions 10 of the structured protection layer 4 are removed in a single step, so that a first portion 6 of the functional layer, which includes at least a part of the contact arrangement 12, a second portion 6 of the functional layer, which includes at least a part of the ventilation opening 17, are exposed.

Figure 10:
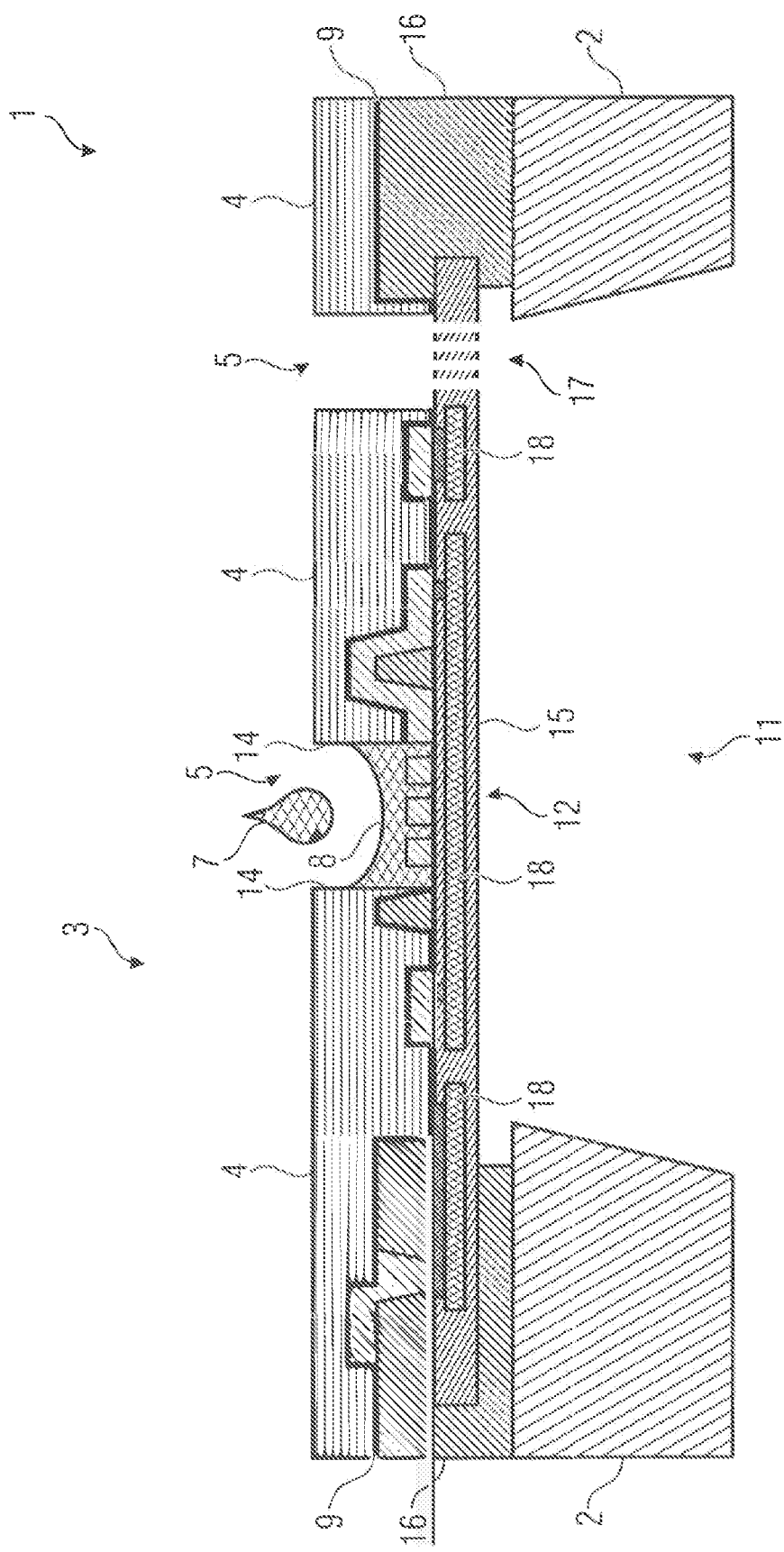
FIG. 10 illustrates an embodiment of the step of applying a dispersion comprising a solvent and electrically conductive components to at least one of the exposed portions of the functional layer so that at least one of the recesses is at least partially filled with the dispersion of a method according to the disclosure in a schematic view.

FIG. 10 illustrates an embodiment of the step of applying a dispersion 7 comprising a solvent and electrically conductive components to at least one of the exposed portions 6 of the functional layer 3 so that at least one of the recesses 6 is at least partially filled with the dispersion 7 of a method according to the disclosure in a schematic view.

It has to be noted that in the embodiment of FIG. 10 the dispersion is only applied to the first portion 10 of the sacrificial layer 9, which covers at least a part of the contact arrangement 12.

Figure 11:
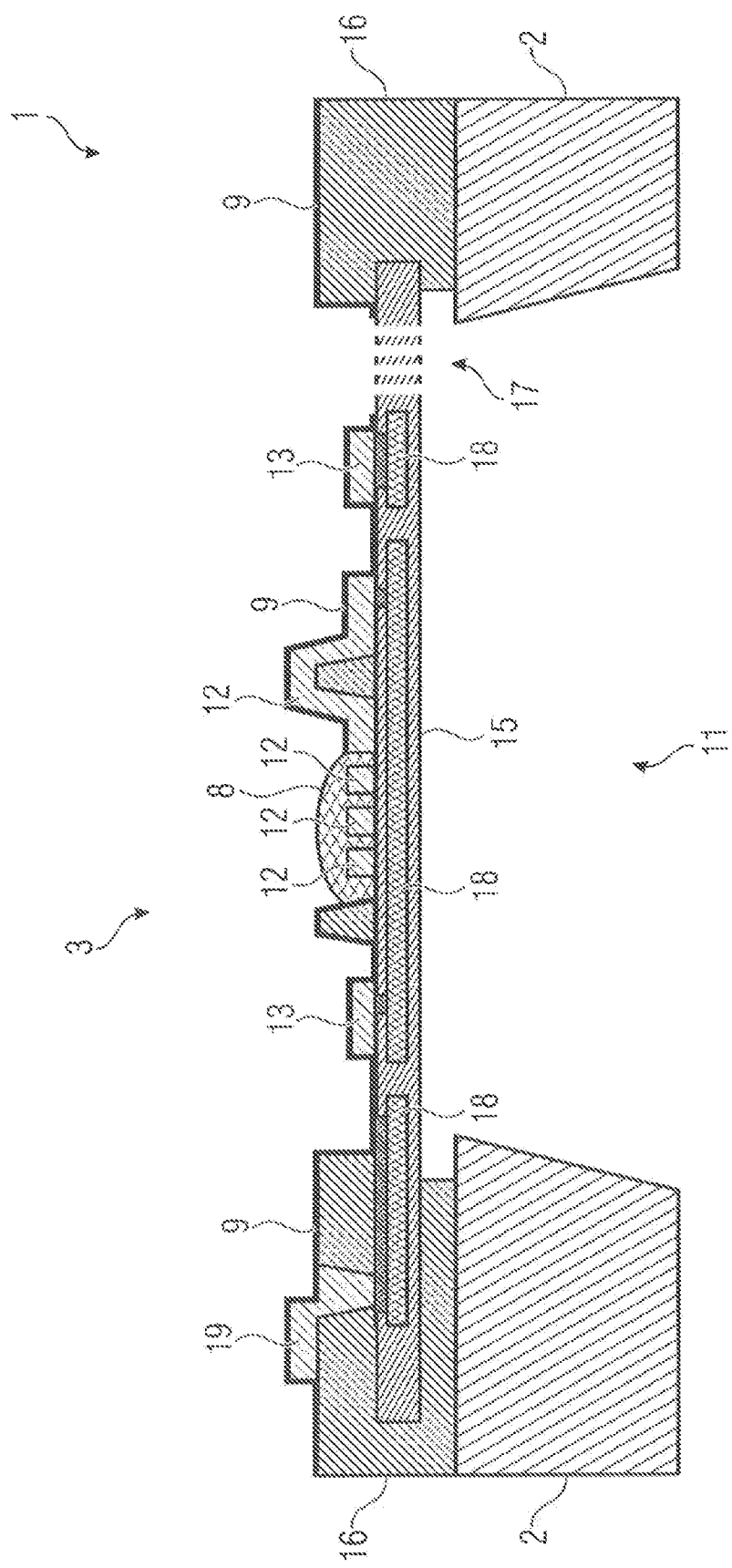
FIG. 11 illustrates an embodiment of the step of drying the dispersion in order to create an electrically conductive layer and of removing the structured protection layer of a method according to the disclosure in a schematic view.

FIG. 11 illustrates an embodiment of the step of drying the dispersion 7 in order to create an electrically conductive layer 8 and of removing the structured protection layer 4 of a method according to the disclosure in a schematic view.

It can be seen in Figure ii that the electrically conductive layer 8 has no coffee ring-like conductive path outside of the actual sensing area.

The essence of the disclosure is to form a structured protection layer for adjacent to the functional layer 3 and to form an electrically conductive layer 8 on the functional layer by depositing a dispersion 7 on the structured protection layer 4.

In particular, the new method can enable coffee ring free graphene coatings 8.

In some embodiments, a structured protection layer for, which may be a structured resist mask, is applied using lithography before the actual printing process. Next step then is the application of the dispersion 7, which may comprise graphene. The application may be done by a printing process in which the dispersion 7 is printed into the previously exposed resist free areas where the dispersion 7 may be printed over the edge of the resist for and then dried. The resulting coffee ring is now outside the area of the electrically conductive layer 8 on the top of the resist for. Then the structured protection layer 4 is removed and with it the coffee ring. This leaves a homogeneous graphene layer 8, which may be an active sensor field, on the functional layer 3.

An alternative would be to apply the graphene ink 7 to the entire surface of the structured protection layer 4, e.g. by using a spray coater. In the following step, the structured protection layer for can be removed and with it the graphene layer 8 on it. Only the areas previously exposed by lithography would then be covered with graphene layer 8.

This creates a structured, homogeneous graphene coating 8 without a coffee ring.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. A method for manufacturing an electronic component, the method comprises:
providing a substrate and a functional layer supported by the substrate, wherein the functional layer comprises a contact arrangement and a ventilation opening;
forming a structured protection layer on a side of the substrate, to which the functional layer is attached to, wherein the structured protection layer has one or more recesses so that one or more portions of the functional layer are exposed;
applying a dispersion comprising a solvent and electrically conductive components to at least one of the exposed portions of the functional layer so that at least one of the recesses is at least partially filled with the dispersion;
drying the dispersion in order to create an electrically conductive layer;
removing the structured protection layer;
applying a sacrificial layer to the functional layer before forming the structured protection layer;
wherein the step of forming the structured protection layer comprises:
forming the structured protection layer on the sacrificial layer, wherein, in each of the recesses of the structured protection layer, one portion of the sacrificial layer is exposed; and
removing the exposed portions of the sacrificial layer after the structured protection layer is formed on the sacrificial layer, wherein the exposed portions are removed only over a portion of the contact arrangement and over the ventilation opening.

2. The method according to claim 1, wherein the functional layer extends over a cavity of the substrate, wherein the structured protection layer is applied to a side of the functional layer, which is facing away from the substrate.

3. The method according to claim 1, wherein the sacrificial layer is applied by a chemical vapor deposition process.

4. The method according to claim 1, wherein the sacrificial layer comprises carbon.

5. The method according to claim 1, wherein the structured protection layer is formed by a photolithographic process, wherein the structured protection layer comprises a photoresist.

6. The method according to claim 1, wherein the portions of the sacrificial layer, which are exposed in the recesses, are removed by a first etching process.

7. The method according to claim 1, wherein the dispersion is applied by an ink jet printing process.

8. The method according to claim 1, wherein the dispersion is applied by a spray coating process.

9. The method according to claim 1, wherein the contact arrangement is formed such that the electrically conductive layer is connected to the contact arrangement so that an electrical resistance of the electrically conductive layer or an electrical capacity between the electrically conductive layer and a reference electrode connected to the contact arrangement can be sensed using the contact arrangement.

10. The method according to claim 1, wherein the electronic component is a chemo-resistive gas sensor, wherein the electrically conductive layer is configured for sensing one or more gases in a mixture of gases, wherein an electrical resistance of the electrically conductive layer or an electrical capacity between the electrically conductive layer and a reference electrode depends on the mixture of gases.

11. The method according to claim 1, wherein the functional layer comprises a heating element configured for heating the electrically conductive layer.

12. The method according to claim 1, wherein the step of applying the dispersion to the at least one of the exposed portions of the functional layer is done such that the dispersion reaches an outer edge of the at least one of the recesses.

13. The method according to claim 12, wherein applying the dispersion to the at least one of the exposed portions of the functional layer is done such that the dispersion extends over the outer edge of the at least one of the recesses.

14. The method according to claim 13, wherein the structured protection layer and a portion of the dispersion, which extends over the outer edge of the at least one of the recesses are removed by a second etching process.

15. The method according to claim 1, wherein unremoved portions of the sacrificial layer are present in a final version of the electrical component.

\* \* \* \* \*

UNITED STATES PATENT AND TRADEMARK OFFICE
CERTIFICATE OF CORRECTION

| | | |
|---|---|---|
| PATENT NO. | : 11,728,073 B2 | |
| APPLICATION NO. | : 17/454545 | |
| DATED | : August 15, 2023 | |
| INVENTOR(S) | : Meyer et al. | |

It is certified that error appears in the above-identified patent and that said Letters Patent is hereby corrected as shown below:

In the Claims

In Column 10, in Claim 12, Line 12, after "wherein" delete "this step of".

Signed and Sealed this
Twelfth Day of December, 2023

Katherine Kelly Vidal
*Director of the United States Patent and Trademark Office*